(12) United States Patent
Sakai

(10) Patent No.: US 12,348,242 B2
(45) Date of Patent: Jul. 1, 2025

(54) D/A CONVERTER

(71) Applicant: ROHM CO., LTD., Kyoto (JP)

(72) Inventor: Mitsuteru Sakai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 442 days.

(21) Appl. No.: 17/850,249

(22) Filed: Jun. 27, 2022

(65) Prior Publication Data

US 2022/0329255 A1  Oct. 13, 2022

Related U.S. Application Data

(63) Continuation of application No. PCT/JP2020/046772, filed on Dec. 15, 2020.

(30) Foreign Application Priority Data

Dec. 27, 2019  (JP) ................................. 2019-239620

(51) Int. Cl.
- *H03F 3/217* (2006.01)
- *H03M 1/74* (2006.01)
- *H04R 3/00* (2006.01)

(52) U.S. Cl.
CPC ............ *H03M 1/74* (2013.01); *H03F 3/2175* (2013.01); *H04R 3/00* (2013.01); *H03F 2200/03* (2013.01); *H04R 2499/13* (2013.01)

(58) Field of Classification Search
CPC .......... H03M 1/74; H03M 1/68; H03M 1/765; H03F 3/2175; H03F 2200/03;
(Continued)

(56) References Cited

U.S. PATENT DOCUMENTS

| | | | |
|---|---|---|---|
| 11,205,999 B2* | 12/2021 | Wen | ...................... H04L 27/122 |
| 2007/0229159 A1 | 10/2007 | Krishnan et al. | |

(Continued)

FOREIGN PATENT DOCUMENTS

| | | |
|---|---|---|
| CN | 101145783 A | 3/2008 |
| JP | H08167847 A | 6/1996 |

(Continued)

OTHER PUBLICATIONS

JPO Notification of Reason(s) for Refusal for corresponding JP Application No. 2021-567307; Issued Sep. 10, 2024.

(Continued)

*Primary Examiner* — Hieu P Nguyen
(74) *Attorney, Agent, or Firm* — CANTOR COLBURN LLP

(57) ABSTRACT

A high-order converter generates a first high-order voltage $V_{U\_P}$ and a second high-order voltage $V_{U\_N}$ that monotonously change with mutually opposite polarities with respect to high-order m bits ($1 \leq m < n$) of the digital signal. A low-order converter generates a first low-order voltage and a second low-order voltage that monotonously change with mutually opposite polarities with respect to low-order (n−m) bits of the digital signal. A first amplifier receives one of the first and the second high-order voltages and one of the first and the second low-order voltages to output one differential analog signal. Having a configuration in common with the first amplifier, a second amplifier receives another of the first and the second high-order voltages and another of the first and the second low-order voltages to output another differential analog signal.

15 Claims, 12 Drawing Sheets

(58) Field of Classification Search
CPC .......... H03F 3/183; H03F 3/2173; H03F 3/68; H04R 3/00; H04R 2499/13; H03K 7/08
USPC ........................................ 330/10, 207 A, 251
See application file for complete search history.

(56) References Cited

U.S. PATENT DOCUMENTS

2010/0245145 A1    9/2010  Motamed
2011/0140944 A1*   6/2011  Hirai ..................... H03M 1/682
                                                    341/145

FOREIGN PATENT DOCUMENTS

JP      2000269811 A    9/2000
JP      2008524963 A    7/2008
JP        4583689 B2   11/2010

OTHER PUBLICATIONS

International Search Report for International Application No. PCT/JP2020/046772; Date of Mailing, Mar. 9, 2021.
PCT International Preliminary Report on Patentability with Written Opinion of the International Searching Authority for International Application No. PCT/2020/046772; Date of Mailing, Mar. 9, 2021.
SIPO Office Action for corresponding CN Application No. 202080086779.7 dated May 17, 2025.

* cited by examiner

D/A CONVERTER

CROSS REFERENCE TO RELATED APPLICATIONS

This application is a continuation under 35 U.S.C. § 120 of PCT/JP2020/046772, filed Dec. 15, 2020, which is incorporated herein by reference, and which claimed priority to Japanese Application No. 2019-239620, filed Dec. 27, 2019. The present application likewise claims priority under 35 U.S.C. § 119 to Japanese Application No. 2019-239620, filed Dec. 27, 2019, the entire content of which is also incorporated herein by reference.

BACKGROUND

1. Technical Field

The present disclosure relates to a D/A converter.

2. Description of the Related Art

A high-efficiency class-D amplifier is used as a power amplifier to drive an electroacoustic transducer such as a speaker and a headphone. FIG. 1 is a block diagram of an audio system 100R including a class-D amplifier. The audio system 100R primarily includes a speaker 102, filters 104P, 104N, and a class-D amplifier circuit 900.

The class-D amplifier circuit 900 drives the speaker 102 in a bridge-tied load (BTL) mode. The filters 104P, 104N are disposed between the speaker 102 and the class-D amplifier circuit 900.

The class-D amplifier circuit 900 of FIG. 1 includes a D/A converter 910, a buffer amplifier 912, a p-side amplifier stage 901P, and an n-side amplifier stage 901N. The D/A converter 910 converts an input digital audio signal $D_{IN}$ into an analog audio signal $V_{DAC}$. The analog audio signal $V_{DAC}$ is input to the p-side amplifier stage 901P and the n-side amplifier stage 901N through the buffer amplifier 912. The p-side amplifier stage 901P amplifies the signal output from the buffer amplifier 912 without phase inversion, and the n-side amplifier stage 901N amplifies the signal output from the buffer amplifier 912 with phase inversion.

The p-side amplifier stage 901P and the n-side amplifier stage 901N have a substantially similar configuration. The amplifier stage 901 # (#=P, N) includes an inverter output stage 902, an integrator 904, a comparator 906, and a driver 908. An inverting amplifier 914 is added to an input stage of the amplifier stage 901P.

The integrator 904 integrates a difference between an input audio signal $S1_{\#}$ and a feedback signal $S_{FB}$ that corresponds to an output signal OUT #. The comparator 906 compares an output from the integrator 904 with a clock signal CLK and outputs a pulse signal $S2_{\#}$. The driver 908 drives the push-pull inverter output stage 902 in response to the pulse signal $S2_{\#}$.

The inventors of the present disclosure, as a result of studying the class-D amplifier circuit 900 of FIG. 1, identified the problem described below. If the D/A converter 910 is of a resistor string type or a resistor ladder type, a resistor produces thermal noise. Thus, the signal $V_{DAC}$ output from the D/A converter 910 includes a signal component $V_{SIG}$ as well as thermal noise $V_{NOISE}$.

$$V_{DAC}=V_{SIG}+V_{NOISE}$$

In regard to the class-D amplifier circuit 900 of FIG. 1, the signal OUTP output from the p-side amplifier stage 901P and the signal OUTN output from the n-side amplifier stage 901N are represented by the following equations:

$$OUTP = g \times V_{DAC}$$

$$OUTN = -g \times V_{DAC}$$

Hence, a driving signal applied across the speaker 102 is given by:

$$OUTP - OUTN = 2g \times V_{DAC}$$
$$= 2g \times (V_{SIG} + V_{NOISE}).$$

The thermal noise $V_{NOISE}$ is amplified and is output from the speaker 102.

SUMMARY

In view of the problem described above, a general purpose of an embodiment of the present disclosure is to provide a D/A converter that delivers improved noise performance.

An embodiment of the present disclosure relates to a D/A converter structured to convert an n-bit digital signal, where n≥2, into differential analog signals. The D/A converter includes: a high-order converter to generate a first high-order voltage and a second high-order voltage that monotonously change with mutually opposite polarities with respect to high-order m bits of the digital signal, where 1≤m>n; a low-order converter to generate a first low-order voltage and a second low-order voltage that monotonously change with mutually opposite polarities with respect to low-order (n−m) bits of the digital signal; a first amplifier to receive one of the first and the second high-order voltages and one of the first and the second low-order voltages to output one of the differential analog signals; and a second amplifier having a configuration in common with the first amplifier, the second amplifier being structured to receive another of the first and the second high-order voltages and another of the first and the second low-order voltages to output another of the differential analog signals.

Another embodiment of the present disclosure relates to an audio amplifier circuit. The audio amplifier circuit includes: the D/A converter to convert a digital audio signal into differential analog signals; a first amplifier to amplify one of the differential analog signals; and a second amplifier to amplify another of the differential analog signals.

Another embodiment of the present disclosure relates to an electronic device. The electronic device includes the audio amplifier circuit.

Another embodiment of the present disclosure relates to an in-vehicle audio system. The in-vehicle audio system includes the audio amplifier circuit.

It is to be noted that any arbitrary combination or rearrangement of the above-described structural components and so forth is effective as and encompassed by the present embodiments. Moreover, all of the features described in this summary are not necessarily required by embodiments so that the embodiment may also be a sub-combination of these described features. In addition, embodiments may have other features not described above.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION

Figure 1:
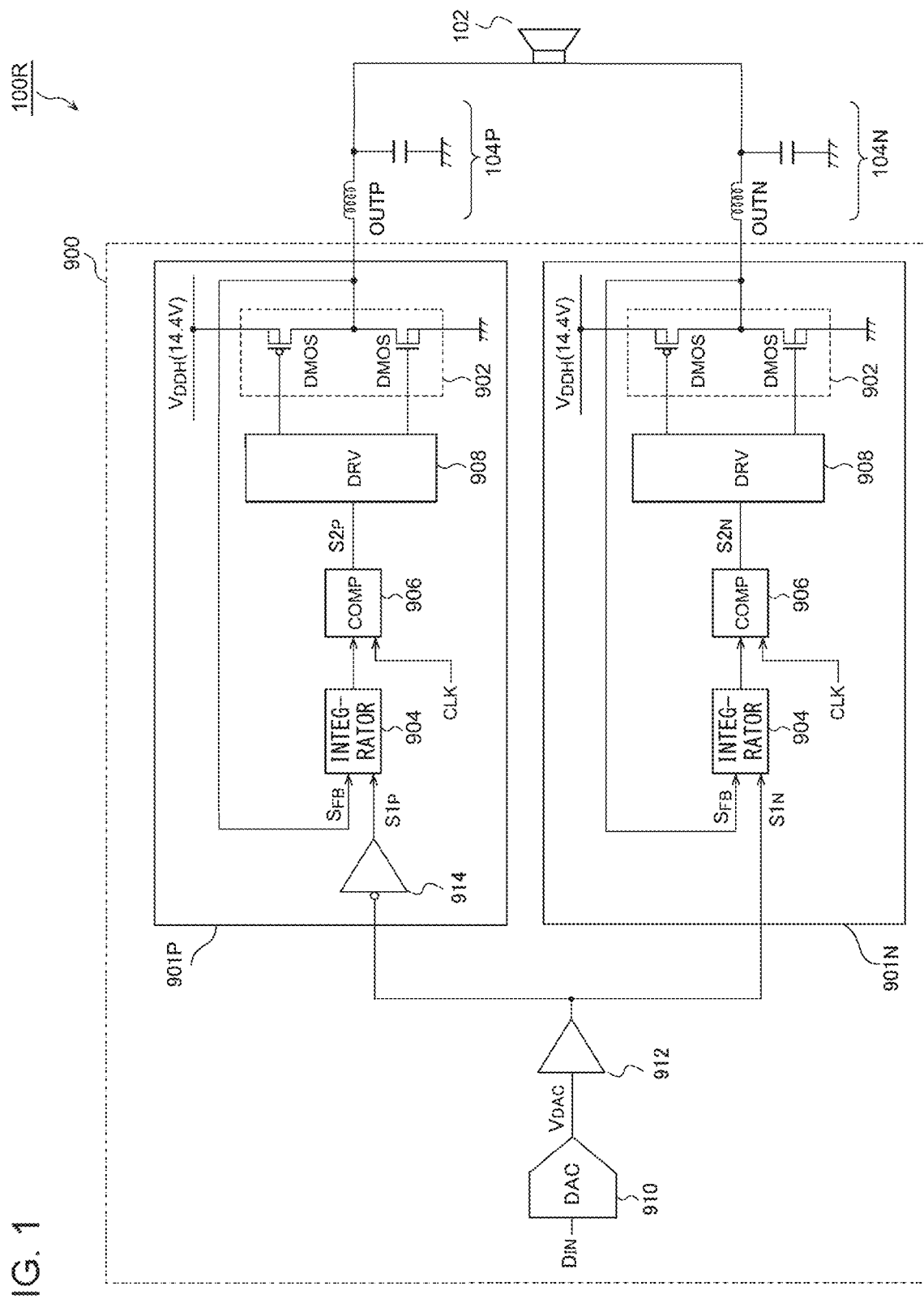
FIG. 1 is a block diagram of an audio system including a class-D amplifier.

An outline of several example embodiments of the disclosure follows. This outline is provided for the convenience of the reader to provide a basic understanding of such embodiments and does not wholly define the breadth of the disclosure. This outline is not an extensive overview of all contemplated embodiments and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "one embodiment" may be used herein to refer to a single embodiment or multiple embodiments of the disclosure.

Outline of Embodiments

An embodiment disclosed in the present specification relates to a D/A converter structured to convert an n-bit digital signal, where $n \geq 2$, into differential analog signals. The D/A converter includes: a high-order converter to generate a first high-order voltage and a second high-order voltage that monotonously change with mutually opposite polarities with respect to high-order m bits of the digital signal, where $1 \leq m < n$; a low-order converter to generate a first low-order voltage and a second low-order voltage that monotonously change with mutually opposite polarities with respect to low-order (n−m) bits of the digital signal; a first amplifier to receive one of the first and the second high-order voltages and one of the first and the second low-order voltages to output one of the differential analog signals; and a second amplifier having a configuration in common with the first amplifier, the second amplifier being structured to receive another of the first and the second high-order voltages and another of the first and the second low-order voltages to output another of the differential analog signals.

The first high-order voltage and the second high-order voltage generated by the high-order converter contain identical common mode noise components. Similarly, the first low-order voltage and the second low-order voltage generated by the low-order converter contain identical common mode noise components. The differential analog signals output by the first amplifier and the second amplifier contain the common mode noise components in phase with each other. Thus, the components cancel each other out and this helps to improve noise performance.

In one embodiment, the first high-order voltage may monotonously increase with respect to the high-order m bits, and the second high-order voltage may monotonously decrease with respect to the high-order m bits in such a way that the first and the second high-order voltages are complementary to each other. The first low-order voltage may monotonously decrease with respect to the low-order (n−m) bits, and the second low-order voltage may monotonously increase with respect to the low-order (n−m) bits in such a way that the first and the second low-order voltages are complementary to each other. The first amplifier may be a subtracting amplifier structured to receive the first high-order voltage at a non-inversion input terminal and the first low-order voltage at an inversion input terminal, and the second amplifier may be a subtracting amplifier structured to receive the second high-order voltage at a non-inversion input terminal and the second low-order voltage at an inversion input terminal. This can cancel out influence of noise.

In one embodiment, the high-order converter may include: a high-order resistor string including a plurality of resistance elements connected in series; a high-order selector connected to a plurality of taps of the high-order resistor string; and a high-order decoder to control the high-order selector and select voltages produced at two out of the plurality of the taps according to the high-order m bits. The low-order converter may include: a low-order resistor string including a plurality of resistance elements connected in series; a low-order selector connected to a plurality of taps of the low-order resistor string; and a low-order decoder to control the low-order selector and select voltages produced at two out of the plurality of the taps according to the low-order (n−m) bits.

In one embodiment, the D/A converter may further include: a first resistor, a second resistor, and a third resistor that are disposed in series between a reference voltage terminal and a ground; and a fourth resistor connected in parallel with the low-order resistor string. The high-order resistor string and the low-order resistor string may be disposed in series on a path extending in parallel with the second resistor. This allows an appropriate reference voltage to be applied across the high-order resistor string and the low-order resistor string. This configuration allows the resistance elements of the high-order resistor string and the low-order resistor string to have a common resistive property. With the second resistor provided, the first and the third resistors each have a decreased resistance value. This helps to reduce an area occupied by the resistors.

In one embodiment, the first resistor, the second resistor, and the third resistor may be paired with one another. The high-order resistor string, the low-order resistor string, and the fourth resistor may be paired with one another. This helps the D/A converter to have an improved characteristic.

In one embodiment, the high-order resistor string may be arranged in a meander form, and the plurality of taps may be arranged in a matrix with A rows and B columns. The high-order selector may include: A pieces of row lines; B pieces of column lines; a first output line; a second output line; a plurality of high-order switches arranged in a matrix with the A rows and the B columns, one end of each of the plurality of high-order switches being connected to a corresponding one of the plurality of taps, other ends of the plurality of high-order switches in i-th row, where $1 \leq i \leq A$, being connected to the row line in i-th row, control terminals of the plurality of high-order switches in j-th column, where $1 \leq j \leq B$, being connected to the column line in j-th column; A pieces of first output switches, one end of each of the A pieces of first output switches being connected to the first output line, another end of each of the A pieces of first output switches being connected to a corresponding one of the A pieces of row lines; and A pieces of second output switches, one end of each of the A pieces of second output switches being connected to the second output line, another end of each of the A pieces of second output switches being connected to a corresponding one of the A pieces of row lines.

This contributes to a reduction in a number of control lines. The row lines that are mutually complementary can be selected with the A pieces of first output switches and the A pieces of second output switches by control. This enables generation of the first high-order voltage and the second high-order voltage that change in such a way as to be complementary.

In one embodiment, the plurality of high-order switches may be complementary metal oxide semiconductor (CMOS) switches.

In one embodiment, the low-order resistor string may be arranged in a meander form, and the plurality of taps may be arranged in a matrix with C rows and D columns. The low-order selector may include: C pieces of row lines; D pieces of column lines; a third output line; a fourth output line; a plurality of low-order switches arranged in a matrix with the C rows and the D columns, one end of each of the plurality of low-order switches being connected to a corresponding one of the plurality of taps, other ends of the plurality of low-order switches in i-th row, where $1 \leq i \leq C$, being connected to the row line in i-th row, control terminals of a plurality of low-order switches in j-th column, where $1 \leq j \leq D$, being connected to the column line in j-th column; C pieces of third output switches, one end of each of the C pieces of third output switches being connected to the third output line, another end of each of the C pieces of third output switches being connected to a corresponding one of the C pieces of row lines; and C pieces of fourth output switches, one end of each of the C pieces of fourth output switches being connected to the fourth output line, another end of each of the C pieces of fourth output switches being connected to a corresponding one of the C pieces of row lines.

This contributes to a reduction in a number of control lines. The row lines that are mutually complementary can be selected with the C pieces of third output switches and the C pieces of fourth output switches by control. This enables generation of the first low-order voltage and the second low-order voltage that change in such a way as to be complementary.

In one embodiment, the plurality of low-order switches may be N-channel metal-oxide semiconductor (NMOS) switches. Because of a low generated voltage, the low-order switches may be NMOS switches rather than CMOS switches. This contributes to a reduction in chip area.

In the present specification, an audio amplifier circuit is disclosed as an application of the D/A converter. The audio amplifier circuit includes: the D/A converter to convert a digital audio signal into differential analog signals; a first power amplifier to amplify one of the differential analog signals; and a second power amplifier to amplify another of the differential analog signals. This configuration allows the D/A converter to provide improved noise performance and thus enables high quality audio reproduction.

In one embodiment, the first power amplifier and the second power amplifier may be class-D amplifiers that each include: an output stage of an inverter-type; an integrator to receive a corresponding one of the differential analog signals and a feedback signal corresponding to a signal output from the output stage; a comparator to convert an output from the integrator into a pulse-width modulation (PWM) signal; and a driver to drive the output stage according to the PWM signal output from the comparator.

In one embodiment, the audio amplifier circuit may further include: an audio interface circuit to receive a digital audio signal; and a frequency divider to divide a master clock signal received by the audio interface circuit and generate a periodic signal of triangular waves or sawtooth waves. The comparator may compare the output from the integrator with the periodic signal and generate the PWM signal.

In one embodiment, the audio amplifier circuit may constitute a circuit integrated onto a substrate. The "integration of the circuit onto the substrate" includes a case in which all components of the circuit are formed on the substrate as well as a case in which primary components of the circuit are integrated on the substrate. Some components such as a resistor and a capacitor may be disposed outside the substrate to allow a circuit constant to be adjusted. The integration of the circuit onto a single chip contributes to both a reduced circuit area and maintained uniformity of circuit element properties.

Embodiments

The present disclosure will now be described based on preferred embodiments which do not intend to limit the scope of the present disclosure but exemplify the present disclosure. All of the features and the combinations thereof described in the embodiment are not necessarily essential to the invention.

In the present specification, a "condition in which a member A is connected to a member B" includes not only a case in which the member A and the member B are physically and directly connected to each other but also a case in which the member A and the member B are indirectly connected to each other through another member that does not have an influence on electrical connection between these members or that does not impair any function.

Similarly, a "condition in which a member C is disposed between a member A and a member B" includes not only a case in which the members A and C or the members B and C are directly connected to each other but also a case in which the two members are indirectly connected to each other through the other member that does not have an influence on electrical connection between the two members or that does not impair any function.

The vertical and horizontal axes of waveform charts and timing diagrams referred to herein are scaled up or down as appropriate to facilitate understanding. Similarly, waveforms shown in the charts or diagrams are simplified, or exaggerated or emphasized to facilitate understanding.

Figure 2:
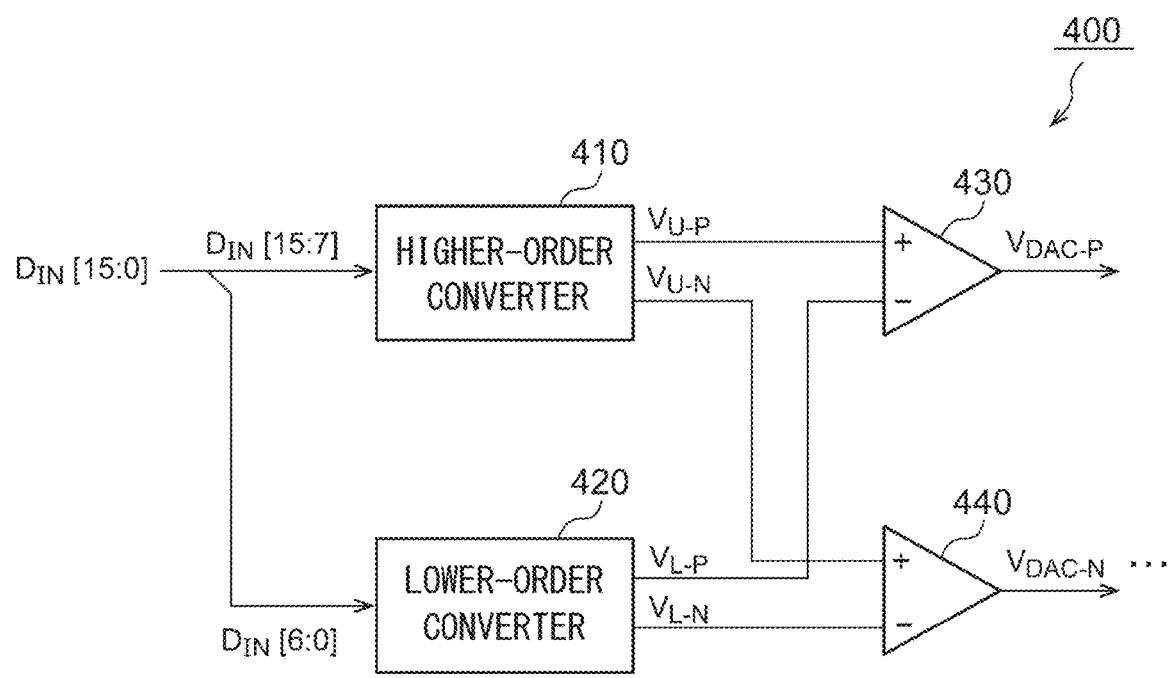
FIG. 2 is a block diagram of a D/A converter according to an embodiment of the present disclosure.

FIG. 2 is a block diagram of a D/A converter 400 according to an embodiment of the present disclosure. The D/A converter 400 includes a high-order converter 410, a low-order converter 420, a first amplifier 430, and a second amplifier 440.

The D/A converter 400 converts an n-bit digital signal $D_{IN}$ (n≥2) into differential analog signals $V_{DAC\_P}$, $V_{DAC\_N}$. The subscript P represents a positive phase, and the subscript N represents a negative phase.

The high-order converter 410 generates a first high-order voltage $V_{U\_P}$ and a second high-order voltage $V_{U\_N}$ that monotonously change with mutually opposite polarities with respect to high-order m bits (1≤m<n) of the digital signal $D_{IN}$. In the following description, it is assumed that m=9.

The low-order converter 420 generates a first low-order voltage $V_{L\_P}$ and a second low-order voltage $V_{L\_N}$ that monotonously change with mutually opposite polarities with respect to low-order (n−m) bits of the digital signal $D_{IN}$.

In the following description, it is assumed that n=16, m=9, and m−n=7, expressed in bits. In other words, high-order 9 bits [15:7] of the digital signal $D_{IN}$ are fed to the high-order converter 410, and low-order 7 bits [6:0] of the digital signal $D_{IN}$ are fed to the low-order converter 420.

In the present embodiment, it is assumed that the first high-order voltage $V_{U\_P}$ monotonously increases with respect to the high-order m bits, whereas the second high-order voltage $V_{U\_N}$ monotonously decreases with respect to the high-order m bits, and these voltages are complementary to each other.

Meanwhile, it is assumed that the first low-order voltage $V_{L\_P}$ monotonously decreases with respect to the low-order (n−m) bits, whereas the second low-order voltage $V_{L\_N}$ monotonously increases with respect to the low-order (n−m) bits, and these voltages are complementary to each other.

The first amplifier 430 receives one voltage $V_{U\_P}$ of the first and the second high-order voltages $V_{U\_P}$ and $V_{U\_N}$ and one voltage $V_{L\_P}$ of the first and the second low-order voltages $V_{L\_P}$ and $V_{L\_N}$ to output one differential analog signal $V_{DAC\_P}$.

Having a configuration in common with the first amplifier 430, the second amplifier 440 receives another voltage $V_{U\_N}$ of the first and the second high-order voltages $V_{U\_P}$ and $V_{U\_N}$ and another voltage $V_{L\_N}$ of the first and the second low-order voltages $V_{L\_P}$ and $V_{L\_N}$ to output another differential analog signal $V_{DAC\_N}$.

The first amplifier 430 is a subtracting amplifier configured to receive the first high-order voltage $V_{U\_P}$ at a non-inversion input terminal (+) and the first low-order voltage $V_{L\_P}$ at an inversion input terminal (−), and the voltage $V_{DAC\_P}$ output from the first amplifier is represented by Equation (1):

$$V_{DAC\_P} = g \times (V_{U\_P} - V_{L\_P}) \quad (1)$$

The second amplifier 440 is a subtracting amplifier configured to receive the second high-order voltage $V_{U\_N}$ at a non-inversion input terminal (+) and the second low-order voltage $V_{L\_N}$ at an inversion input terminal (−), and the voltage $V_{DAC\_N}$ output from the second amplifier is represented by Equation (2):

$$V_{DAC\_N} = g \times (V_{U\_N} - V_{L\_N}) \quad (2)$$

Figure 3A:
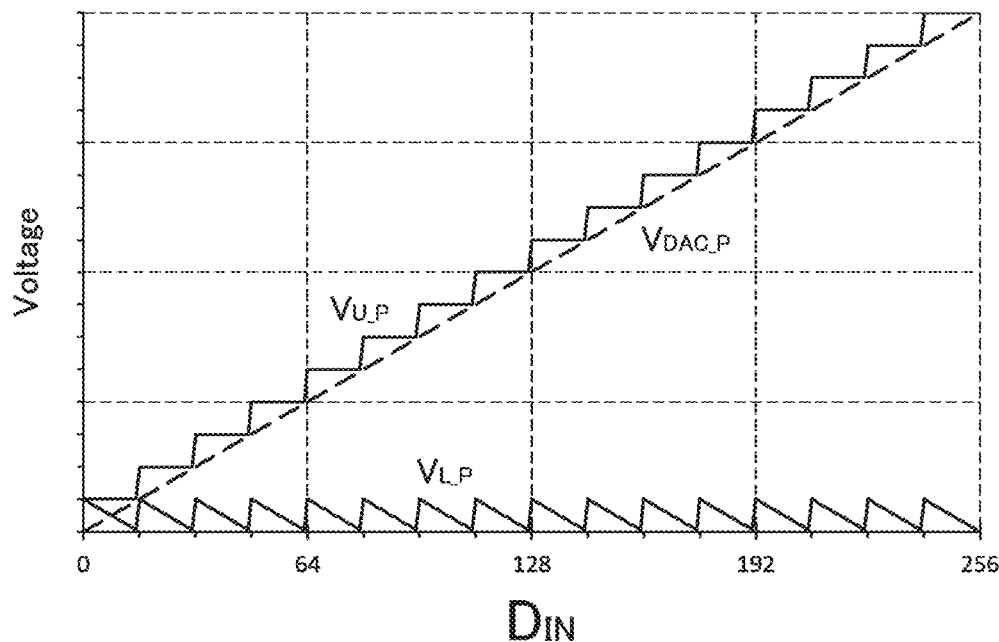
FIG. 3A and FIG. 3B are graphs showing input-output characteristics of the D/A converter of FIG. 2.
Figure 3B:
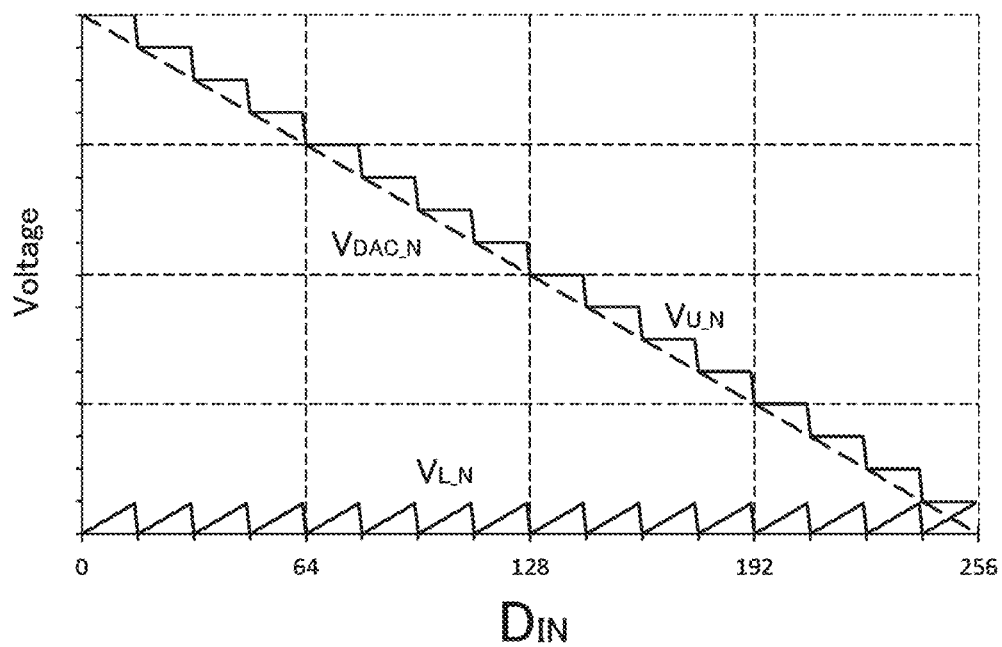

A configuration of the D/A converter 400 has been described above. Next, operation of the converter will be described. FIGS. 3A and 3B are graphs showing input-output characteristics of the D/A converter 400 of FIG. 2. The horizontal axes represent values of the digital signal $D_{IN}$, and the vertical axes represent voltages. Here it is assumed that n=16 and m=4 for simplicity of description.

FIG. 3A shows the high-order voltage $V_{U\_P}$, the low-order voltage $V_{L\_P}$, and the output voltage $V_{DAC\_P}$, which is a difference between these voltages. FIG. 3B shows the high-order voltage $V_{U\_N}$, the low-order voltage $V_{L\_N}$, and the output voltage $V_{DAC\_N}$, which is a difference between these voltages. A range of each of the low-order voltages $V_{L\_P}$, $V_{L\_N}$ is equal to a step size of each of the high-order voltages $V_{U\_P}$, $V_{U\_N}$.

The output voltage $V_{DAC\_P}$ monotonously increases relative to the digital signal $D_{IN}$, whereas the output voltage $V_{DAC\_N}$ monotonously decreases relative to the digital signal $D_{IN}$, and the two output voltages $V_{DAC\_P}$, $V_{DAC\_N}$ are differential signals.

Figure 4A:
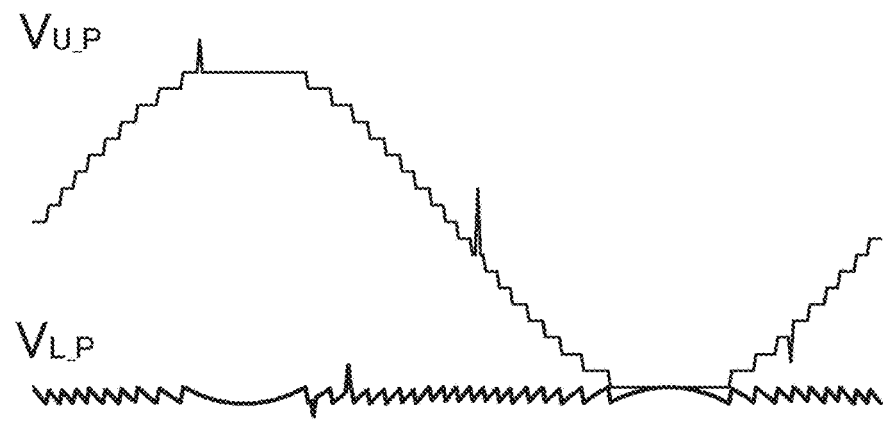
FIG. 4A to FIG. 4C are operation waveform charts of the D/A converter.
Figure 4B:
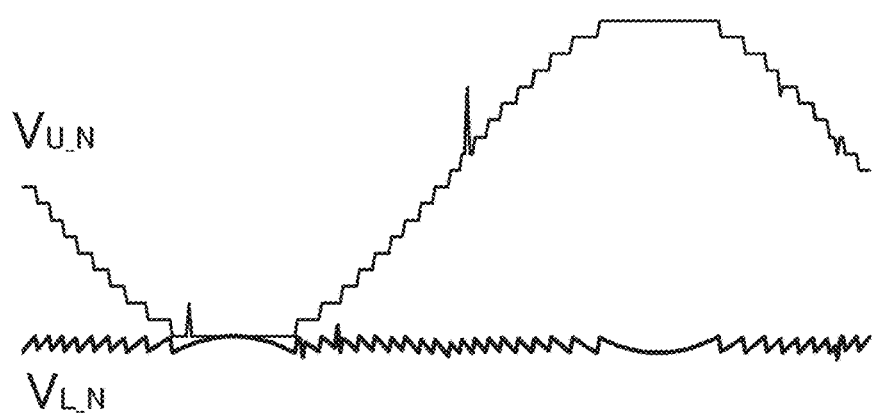
Figure 4C:
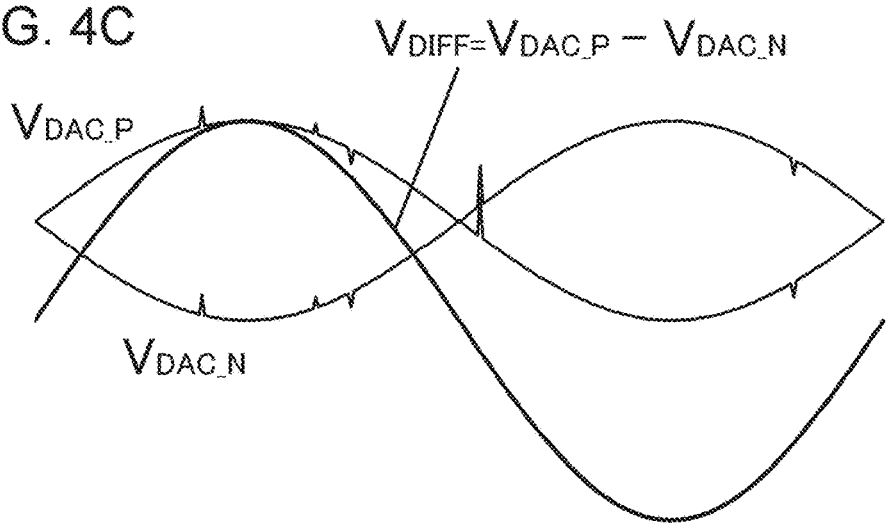

Next, an improvement in noise performance of the D/A converter 400 will be described. FIGS. 4A to FIG. 4C are operation waveform charts of the D/A converter 400.

Here it is assumed that the digital signal $D_{IN}$ is represented by a sinusoidal wave. Since the first high-order voltage $V_{U\_P}$ and the second high-order voltage $V_{U\_N}$ are generated by the shared high-order converter 410, in-phase noise is contained in these voltages. Similarly, since the first low-order voltage $V_{L\_P}$ and the second low-order voltage $V_{L\_N}$ are generated by the shared low-order converter 420, common mode noise is contained in these voltages. Thus, the output voltage $V_{DAC\_P}$ of the first amplifier 430 and the output voltage $V_{DAC\_N}$ of the second amplifier 440 contain signal components opposite in phase from each other and common mode noise.

The two output voltages $V_{DAC\_P}$, $V_{DAC\_N}$, which are outputs from the D/A converter 400, are used as differential signals and thus a difference between these voltages, $V_{DIFF} = V_{DAC\_P} - V_{DAC\_N}$, is a signal component. The signal component $V_{DIFF}$ does not contain the noise superposed by the high-order converter 410 and the low-order converter 420.

The operation of the D/A converter 400 has been described above. The D/A converter 400 provides improved noise performance.

In the waveform charts of FIG. 4A to FIG. 4C, cancellation of a noise component during reproduction of an audio signal is shown. Under small-signal or no-signal conditions, an effect of the noise cancellation is more noticeable.

Here it is assumed that a noise component generated by the high-order converter 410 or the low-order converter 420 is indicated by $V_{X\_Y}$, where X=U or L, and Y=P or N. Under small-signal conditions, $V_{U\_P} \approx V_{U\_N}$, and $V_{L\_P} \approx V_{L\_N}$. Thus, a noise component produced by resistance of the converters is canceled out through BTL output. Under no-signal conditions, $V_{U\_P} = V_{U\_N}$, and $V_{L\_P} = V_{L\_N}$. Thus, a noise component produced by resistance of the converters is canceled out through BTL output.

The scope of the present disclosure should extend to various apparatuses and methods that are understood as the block diagram or circuit diagram of FIG. 2 or are derived from the description above and should not be limited to any specific configuration. Hereafter more specific example configurations or examples will be described to help understand the essence and working of the invention and clarify them rather than limiting the scope of the invention.

Figure 5:
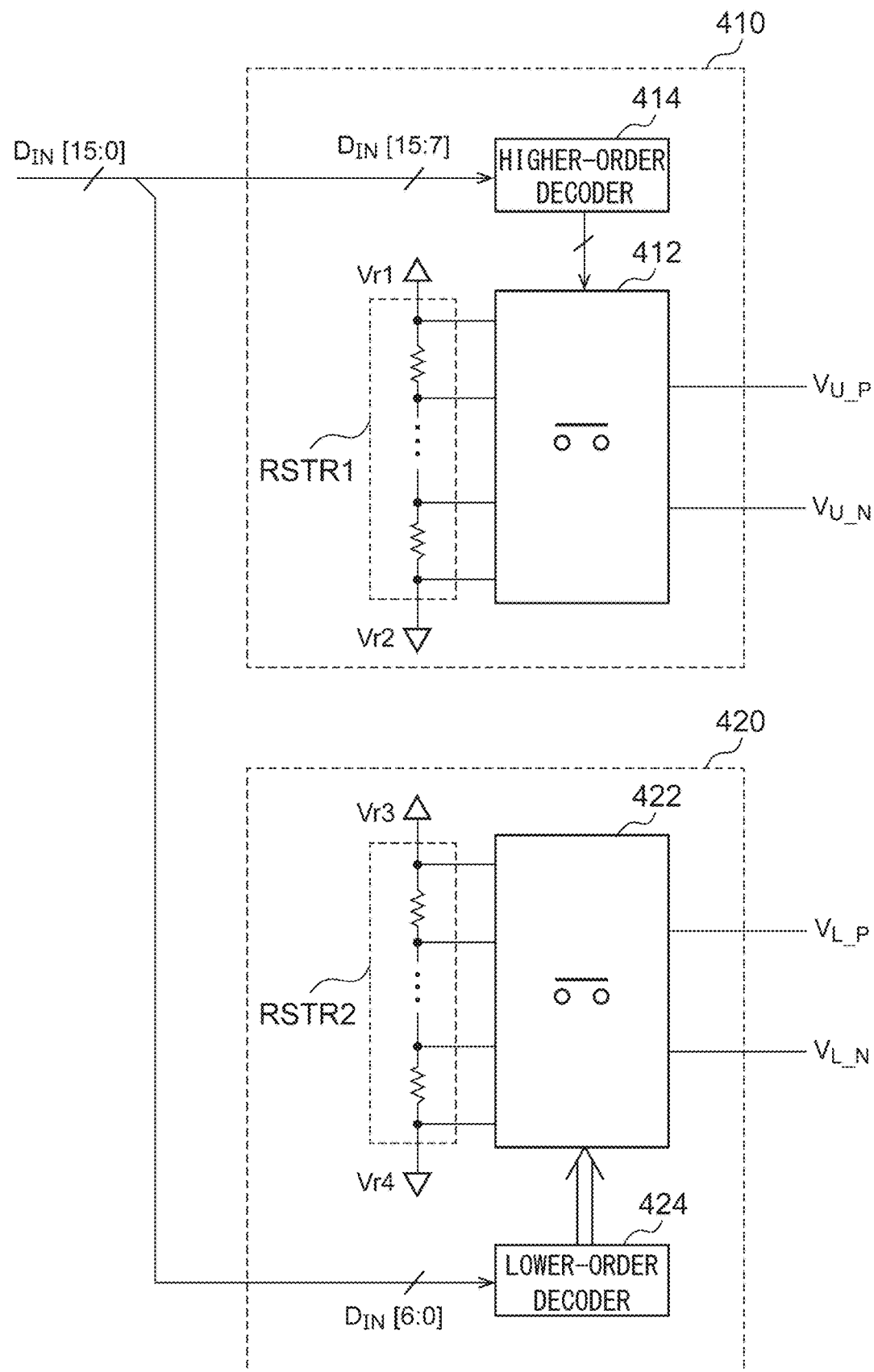
FIG. 5 is a circuit diagram showing an example of a configuration of a high-order converter and a low-order converter.

FIG. 5 is a circuit diagram showing an example of a configuration of the high-order converter 410 and the low-order converter 420. The high-order converter 410 includes a high-order resistor string RSTR1, a high-order selector 412, and a high-order decoder 414. The high-order resistor string RSTR1 includes a plurality ($2^m - 1 = 511$ pieces) of resistance elements connected in series, and taps are disposed at nodes each connecting the adjacent resistance elements together. A first reference voltage Vr1 is applied to one end of the high-order resistor string RSTR1, and a second reference voltage Vr2 is applied to another end of the same resistor string. The high-order selector 412 is connected to a plurality of the taps of the high-order resistor string RSTR1 and includes a plurality of switches inside. The high-order decoder 414 controls the high-order selector 412 and selects voltages $V_{U\_P}$, $V_{U\_N}$ produced at two taps according to high-order m bits $D_{IN}$ [15:7]. Specifically, two taps placed symmetrical about a center are selected.

Similarly, the low-order converter 420 includes a low-order resistor string RSTR2, a low-order selector 422, and a low-order decoder 424. The low-order resistor string RSTR2 includes a plurality ($2^{n-m}-1=127$ pieces) of resistance elements connected in series, and taps are disposed at nodes each connecting the adjacent resistance elements together. A third reference voltage Vr3 is applied to one end of the low-order resistor string RSTR2, and a fourth reference voltage Vr4 is applied to another end of the same resistor string. The low-order selector 422 is connected to a plurality of the taps of the low-order resistor string RSTR2 and includes a plurality of switches inside. The low-order decoder 424 controls the low-order selector 422 and selects voltages $V_{L\_P}$, $V_{L\_N}$ at two taps according to low-order (n−m) bits $D_{IN}$ [6:0]. Specifically, two taps placed symmetrical about a center are selected.

Vr2 may be equal to Vr3 but is not limited to that.

Figure 6:
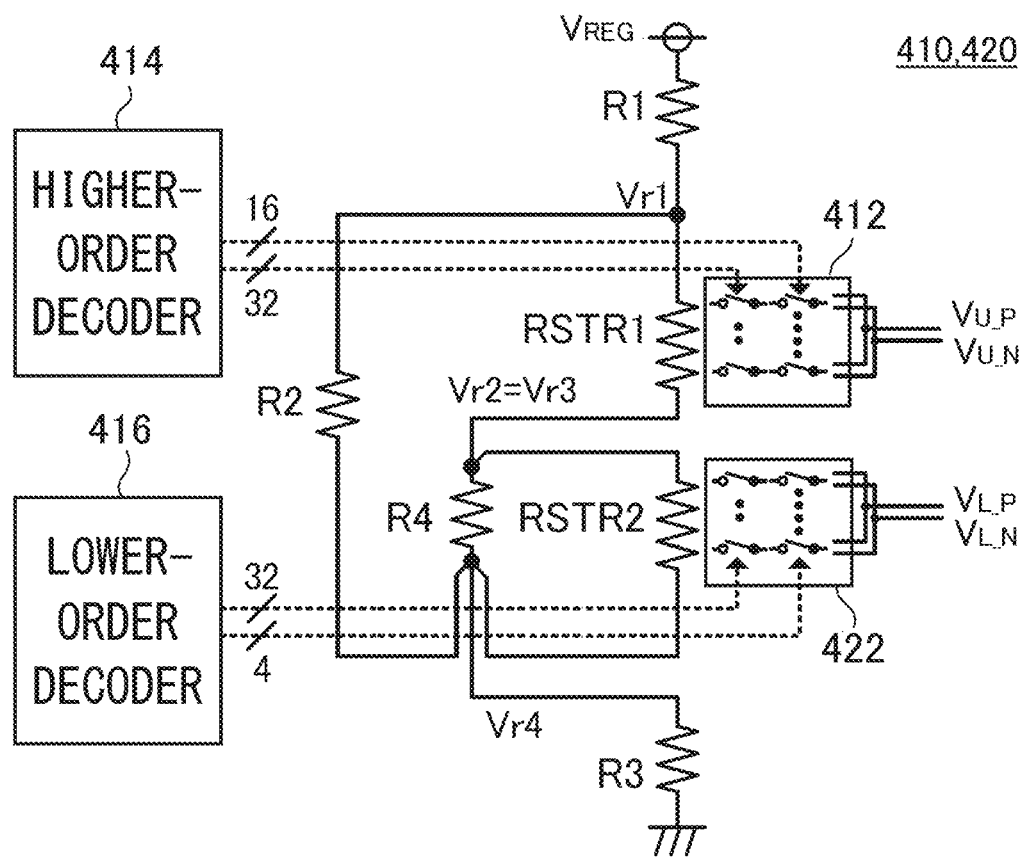
FIG. 6 is a circuit diagram showing an example of a specific configuration of the high-order converter and the low-order converter.

FIG. 6 is a circuit diagram showing an example of a specific configuration of the high-order converter 410 and the low-order converter 420. The high-order converter 410 and the low-order converter 420 include a first resistor R1, a second resistor R2, a third resistor R3, and a fourth resistor R4 in addition to the high-order resistor string RSTR1 and the low-order resistor string RSTR2. The first resistor R1 to the third resistor R3 are disposed in series between a reference voltage terminal $V_{REG}$ and a ground. The fourth resistor R4 is connected in parallel with the low-order resistor string RSTR2.

If the converters do not have the resistors R1 to R4, a resistance value of the resistance elements of the low-order resistor string RSTR2 needs to be designed to be 1/127 times as much as a resistance value of the resistance elements of the high-order resistor string RSTR1. In this configuration, with the resistors R1, R2, R3, and R4 being properly designed, the resistance elements of the high-order resistor string RSTR1 and the resistance elements of the low-order resistor string RSTR2 are allowed to have a common resistance value.

Preferably, the first resistor R1, the second resistor R2, and the third resistor R3 are paired with one another. Preferably, the high-order resistor string RSTR1, the low-order resistor string RSTR2, and the fourth resistor R4 are paired with one another. This helps to cancel out an influence of resistance variation and improve characteristics such as integral nonlinearity and differential nonlinearity.

Figure 7:
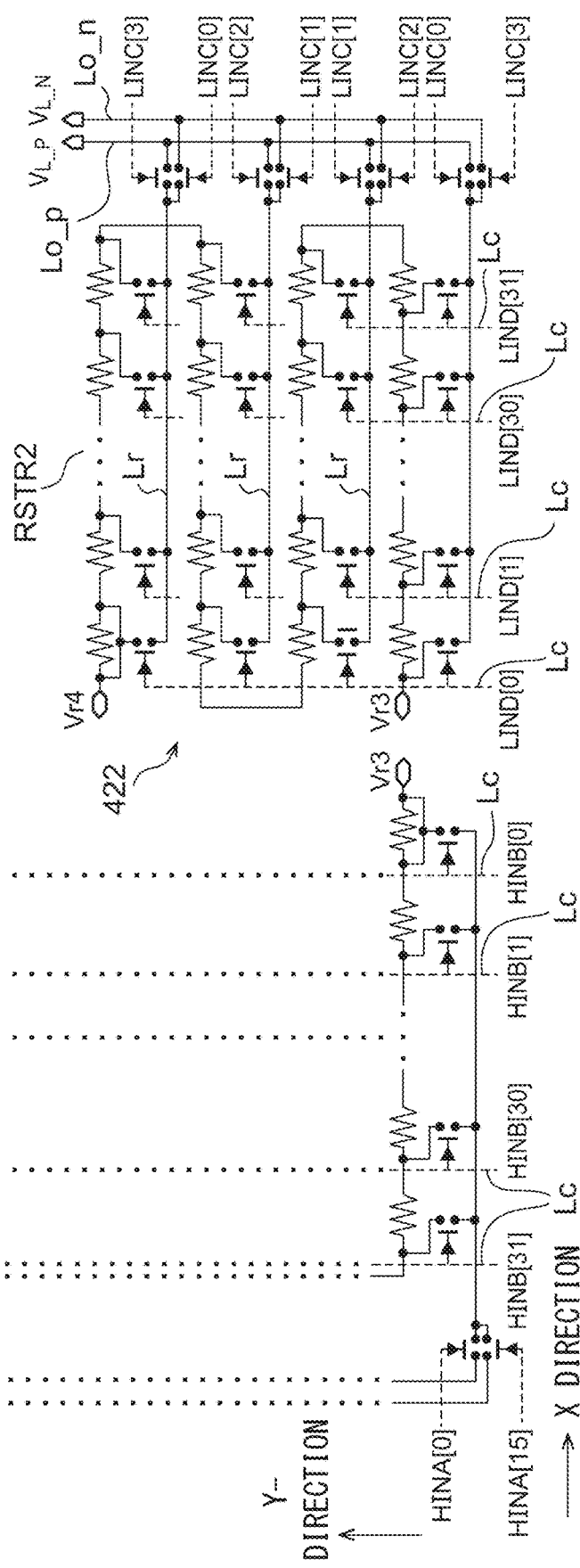
FIG. 7 is a circuit diagram of a high-order selector and a low-order selector in FIG. 6.

With reference to FIG. 7, a configuration of the high-order selector 412 and the low-order selector 422 will be described. FIG. 7 is a circuit diagram of the high-order selector 412 and the low-order selector 422 in FIG. 6.

The high-order resistor string RSTR1 includes $2^m=512$ pieces of the resistance elements in a meander form, and the plurality of taps are arranged in a matrix with A rows and B columns. Specifically, a portion of a bar including B=32 pieces of the resistance elements is disposed along an X direction, with the bar having a lot of curves. As a result, in this example, A=16 and B=32. The resistance element on a least electric potential (Vr3) side is short-circuited.

The high-order selector 412 includes a plurality ($2^m=512$ pieces) of high-order switches SWu arranged in a matrix with A rows and B columns, A pieces of row lines Lr, B pieces of column lines Lc, A pieces of first output switches SWo_p, and A pieces of second output switches SWo_n. One end of each of the high-order switches SWu is connected to a corresponding tap. Other ends of the plurality of high-order switches SWu in i-th row ($1 \leq i \leq A$) are connected to the row line Lr in i-th row, and control terminals of the plurality of high-order switches SWu in j-th column ($1 \leq j \leq B$) are connected to the column line Lc in j-th column.

One end of each of the A pieces of first output switches SWo_p is connected to a first output line Lo_p, and another end of each of the same switches is connected to a corresponding one of the A pieces of row lines Lr. One end of each of the A pieces of second output switches SWo_n is connected to a second output line Lo_n, and another end of each of the same switches is connected to a corresponding one of the A pieces of row lines Lr. Preferably, the plurality of high-order switches are complementary metal oxide semiconductor (CMOS) switches.

The high-order decoder 414 generates pieces of 32-bit data HINB [31:0] that are to be applied to a plurality of the column lines Lc.

The high-order decoder 414 generates control signals HINA [15:0] that are to be applied to a plurality of the first output switches SWo_p. The control signals HINA [15:0] are assigned in inverse order to a plurality of the second output switches SWo_n.

The low-order resistor string RSTR2 and the low-order selector 422 are configured in a similar fashion. The low-order resistor string RSTR2 includes $2^{n-m}=128$ pieces of the resistance elements in a meander form, and the plurality of taps are arranged in a matrix with C rows and D columns. Specifically, a portion of a bar including D=32 pieces of the resistance elements is disposed along the X direction, with the bar having a lot of curves. As a result, in this example, C=4 and D=32. The resistance element on a least electric potential (Vr4) side is short-circuited.

The low-order selector 422 includes a plurality ($2^{n-m}=256$ pieces) of low-order switches SW1 arranged in a matrix with C rows and D columns, C pieces of row lines Lr, D pieces of column lines Lc, C pieces of third output switches SWo_p, and C pieces of second output switches SWo_n. One end of each of the low-order switches SW1 is connected to a corresponding tap, and other ends of the plurality of the low-order switches SW1 in i-th row ($1 \leq i \leq C$) are connected to the row line Lr in i-th row. Control terminals of the plurality of low-order switches SW1 in j-th column ($1 \leq j \leq D$) are connected to the column line Lc in j-th column.

One end of each of the C pieces of third output switches SWo_p is connected to a third output line Lo_p, and another end of each of the same switches is connected to a corresponding one of the C pieces of row lines Lr. One end of each of the C pieces of fourth output switches SWo_n is connected to a fourth output line Lo_n, and another end of each of the same switches is connected to a corresponding one of the C pieces of row lines Lr. Preferably, the plurality of low-order switches are N-channel metal-oxide semiconductor (NMOS) switches. This enables reduction of a chip area.

The low-order decoder 424 generates pieces of 32-bit data LINC [31:0] that are to be applied to a plurality of the column lines Lc.

The low-order decoder 424 generates control signals LIND [15:0] that are to be applied to a plurality of the third output switches SWo_p. The control signals LIND [15:0] are assigned in inverse order to a plurality of the fourth output switches SWo_n.

According to this configuration, the high-order resistor string RSTR1 and the low-order resistor string RSTR2 are each arranged in a meander form, and the switches are arranged in a matrix. This contributes to a reduction in a number of control lines.

If the high-order selector 412 includes individual selectors in which one is used to draw out the first high-order voltage $V_{U\_P}$ and the other is used to draw out the second high-order voltage $V_{U\_N}$, the number of switches would be huge. Specifically, A×B×2=512×2=1024 pieces of switches are required. In contrast to this case, the configuration of FIG. 7 allows the number of switches to be decreased to A×B+A×2=512+32=544 pieces. The low-order selector 422 can also produce a similar effect.

Figure 8:
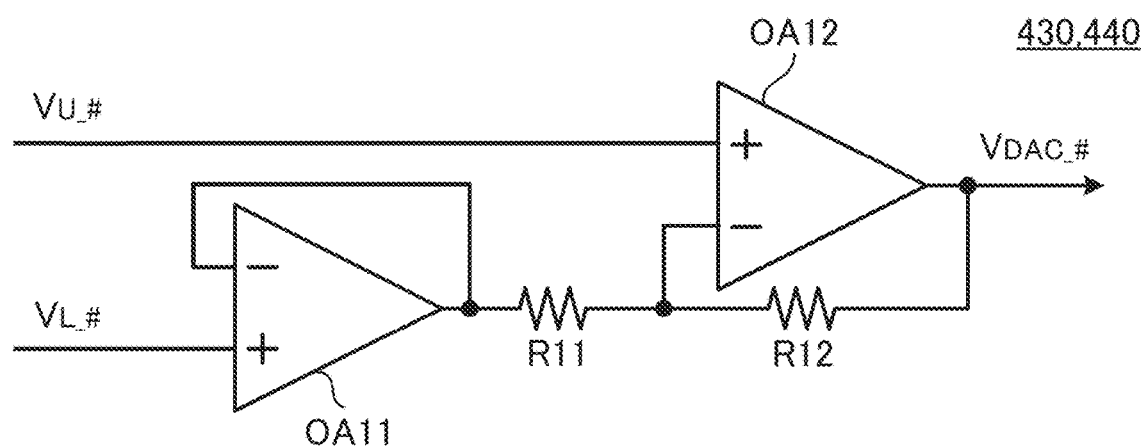
FIG. 8 is a circuit diagram showing an example of a configuration of a first amplifier and a second amplifier.

FIG. 8 is a circuit diagram showing an example of a configuration of the first amplifier 430 and the second amplifier 440. As described above, the first amplifier 430 and the second amplifier 440 have a common configuration and each include operational amplifiers OA11, OA12 and resistors R11, R12. The operational amplifier OA11 constitutes a buffer (a voltage follower) and receives a low-order voltage $V_{L\_\#}$ (#=P, N). The operational amplifier OA12 and the resistors R11, R12 constitute a subtracting amplifier (a subtracting circuit) and output a voltage $V_{DAC\#}$ in response to a difference between two input voltages $V_{U\_\#}$ and $V_{L\_\#}$.

Next, a variation of the D/A converter 400 will be described.

In the embodiment, the first low-order voltage $V_{L\_P}$ monotonously decreases with respect to the low-order bits of the digital signal $D_{IN}$, and the second low-order voltage $V_{L\_N}$ monotonously increases with respect to the low-order bits of the digital signal $D_{IN}$. However, this should not be construed to limit the scope of the present disclosure. The first low-order voltage $V_{L\_P}$ may monotonously increase with respect to the low-order bits of the digital signal $D_{IN}$, and the second low-order voltage $V_{L\_N}$ may monotonously decrease with respect to the low-order bits of the digital signal $D_{IN}$. In this case, rather than the subtracting circuit, the first amplifier 430 and the second amplifier 440 may each include an adding circuit:

$$V_{DAC\_P}=g\times(V_{U\_P}+V_{L\_P})$$

$$V_{DAC\_N}=g\times(V_{U\_N}+V_{L\_N})$$

In the embodiment, the high-order converter 410 and the low-order converter 420 are configured for a resistor voltage divider D/A converter. However, this should not be construed to limit the scope of the present disclosure. The converters may be configured for a D/A converter of another type.

Figure 9:
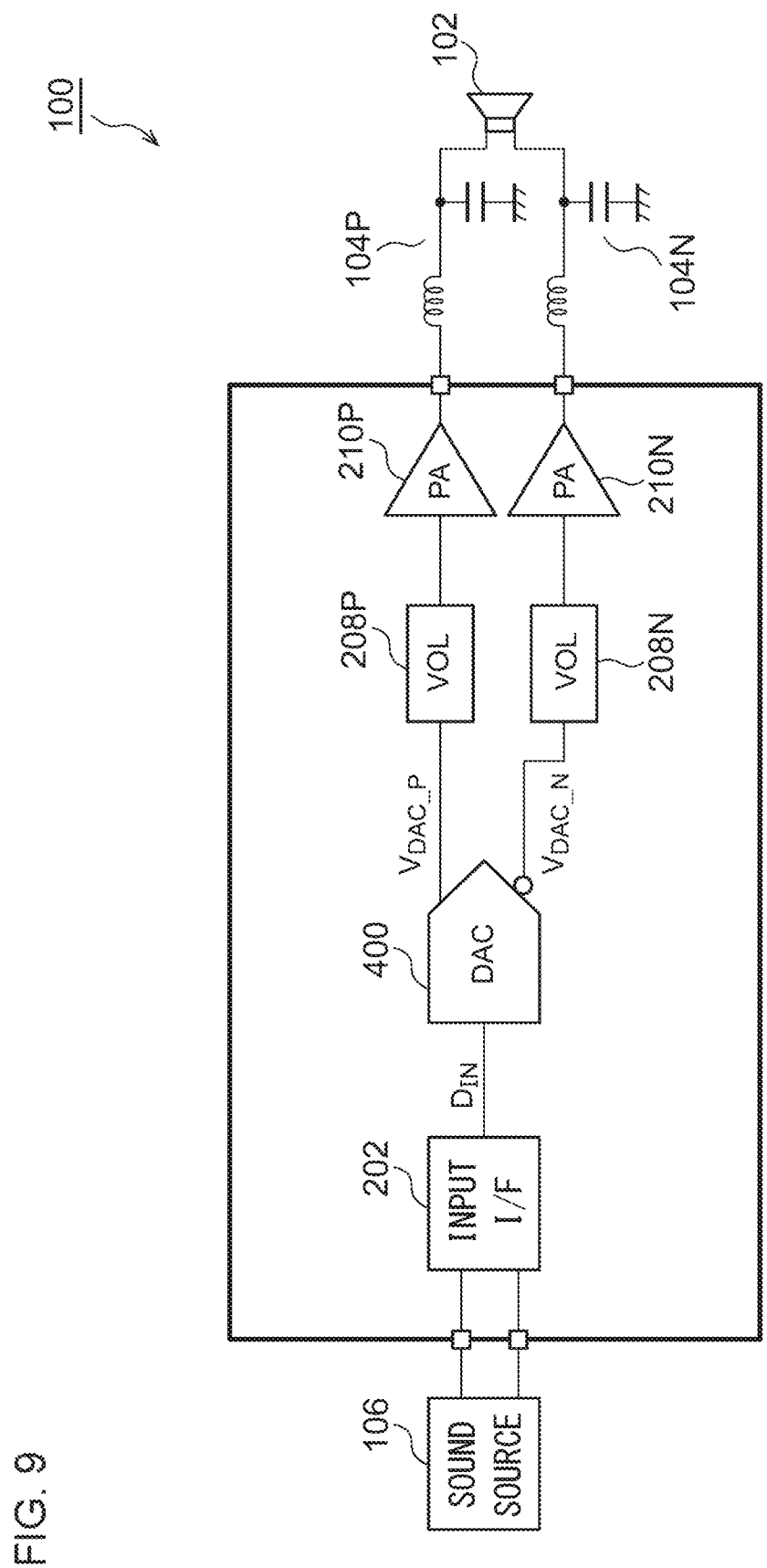
FIG. 9 is a block diagram of an audio system including the D/A converter of FIG. 2.

Next, applications of the D/A converter 400 will be described. FIG. 9 is a block diagram of an audio system 100 including the D/A converter 400. The audio system 100 includes a speaker 102, filters 104P, 104N, a sound source 106, and an audio amplifier circuit 200.

The audio amplifier circuit 200 includes an audio interface circuit 202, the D/A converter 400, a first power amplifier 210P, and a second power amplifier 210N that are integrated onto a single semiconductor substrate.

The audio interface circuit 202 receives a digital signal from the external sound source 106. The D/A converter 400 converts the digital audio signal received by the audio interface circuit 202 into differential analog signals $V_{DAC\_P}$, $V_{DAC\_N}$. The differential analog signals $V_{DAC\_P}$, $V_{DAC\_N}$ are input into the first power amplifier 210P and the second power amplifier 210N via volume circuits 208P, 208N, respectively. The volume circuits 208P, 208N may be omitted. The first power amplifier 210P amplifies the signal $V_{DAC\_P}$, which is one of the differential analog signals. The second power amplifier 210N amplifies the signal $V_{DAC\_N}$, which is another of the differential analog signals. A method for amplification used by the first and the second power amplifiers 210P and 210N is not limited and may be class-AB or class-D amplification.

Figure 10:
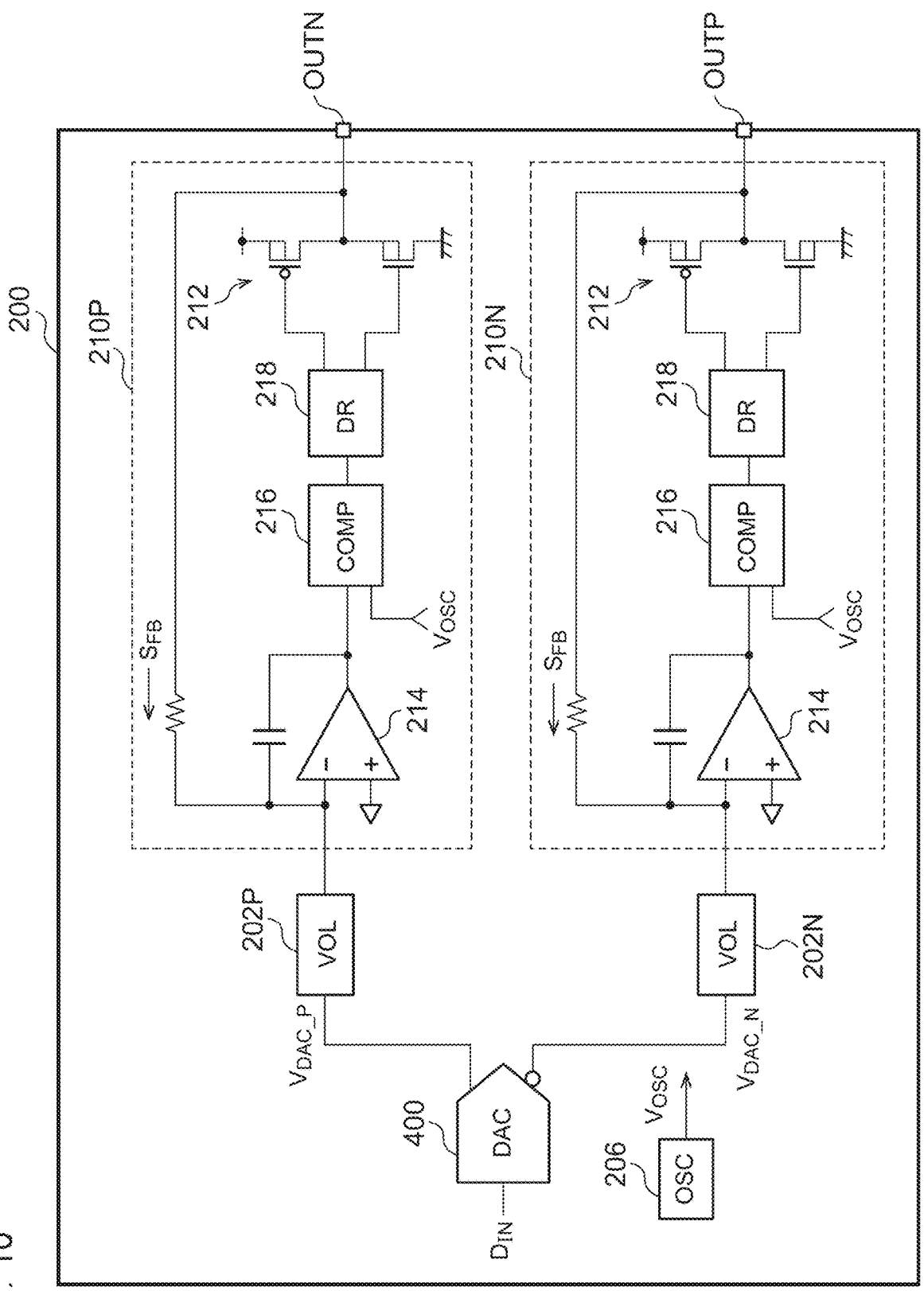
FIG. 10 is a circuit diagram showing an example of a configuration of an audio amplifier circuit.

FIG. 10 is a circuit diagram showing an example of a configuration of the audio amplifier circuit 200. In this example, the first power amplifier 210P and the second power amplifier 210N are class-D amplifiers that have a shared configuration. The power amplifier 210 includes an inverter-type output stage 212, an integrator 214, a comparator 216, and a driver 218. The integrator 214 receives a corresponding one of differential analog signals $V_{DAC\_P}$, $V_{DAC\_N}$ and a feedback signal $S_{FB}$ corresponding to a signal output from the output stage 212. The comparator 216 converts an output from the integrator 214 into a pulse-width modulation (PWM) signal $S_{PWM}$. Specifically, the comparator 216 compares an output from the integrator 214 with a periodic signal $V_{OSC}$ and generates a PWM signal. The periodic signal $V_{OSC}$ is made up of triangular waves or sawtooth waves. A frequency divider 206 may generate the period signal by dividing a master clock signal received by the audio interface circuit 202. The driver 218 drives the output stage 212 according to the signal $S_{PWM}$ output from the comparator 216.

Results of a simulation conducted on noise performance of the class-D amplifier circuit of FIG. 1 and the audio amplifier circuit 200 of FIG. 10 will be described. Noise made by the class-D amplifier circuit of FIG. 1 was 135.3 μVrms when the circuit was designed with a gain of 20 dB and was 254.7 μVrms when the circuit was designed with a gain of 26 dB. In contrast to this case, noise made by the audio amplifier circuit 200 of FIG. 10 was 52.9 μVrms when the circuit was designed with a gain of 20 dB and was 89.9 μVrms when the circuit was designed with a gain of 26 dB, showing a substantial improvement, a decrease in noise level to around one third, compared to the conventional technique. Moreover, noise made by the audio amplifier circuit 200 of FIG. 10 was 14.89 μVrms when the circuit was designed with a gain of 0 dB and was 20.22 μVrms when the circuit was designed with a gain of 5 dB, showing a further improvement in noise performance.

Applications

Figure 11:
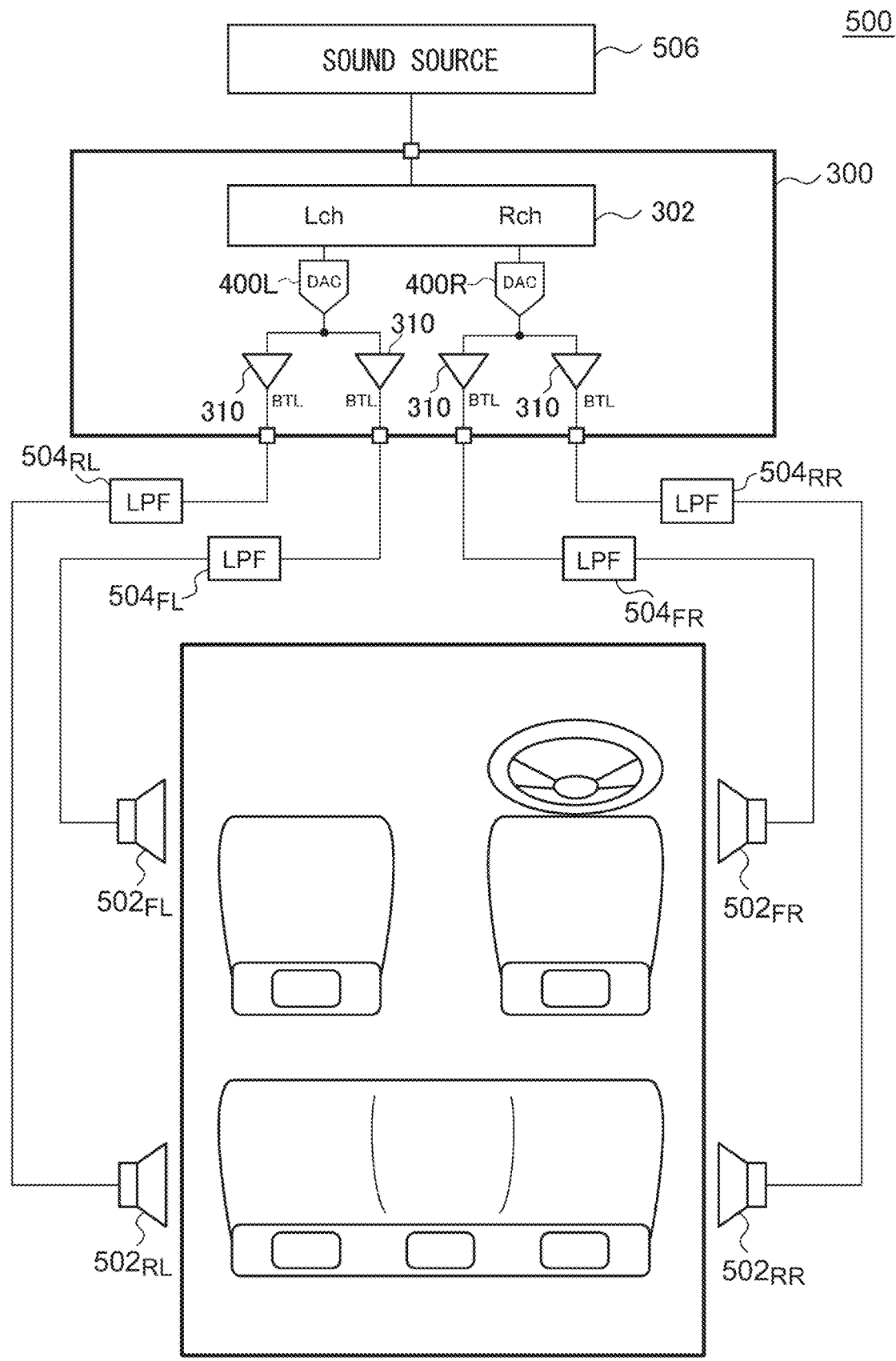
FIG. 11 is a block diagram of an in-vehicle audio system using an audio circuit according to an embodiment of the present disclosure.

Applications of the audio amplifier circuit 200 will be described. FIG. 11 is a block diagram of an in-vehicle audio system using an audio circuit according to an embodiment of the present disclosure.

An in-vehicle audio system 500 includes four speakers $502_{FL}$, $502_{FR}$, $502_{RL}$, $502_{RR}$, four filters $504_{FL}$, $504_{FR}$, $504_{RL}$, $504_{RR}$, a sound source 506, and an audio amplifier circuit 300.

The sound source 506 outputs left-right (LR) 2-channel or multi-channel digital signals. The audio amplifier circuit 300 includes 4-channel power amplifiers 310, the sound source 506, and an audio interface circuit 302. A type of the audio interface circuit 302 is not limited.

D/A converters 400L and 400R convert digital audio signals of L- and R-channels into differential analog audio signals. In FIG. 11, although indicated with a single-ended amplifier symbol, the power amplifiers 310 correspond to the power amplifiers 210P/210N of FIG. 9 and drive the corresponding speakers 502 in a BTL mode. The power amplifiers 310 may be class-D amplifiers or class-AB amplifiers.

The filters 504, the sound source 506, and the audio amplifier circuit 300 are built in an audio head unit or a car navigation apparatus. Alternatively, the audio amplifier circuit 300 may be a product independent of the sound source 506.

Figure 12A:
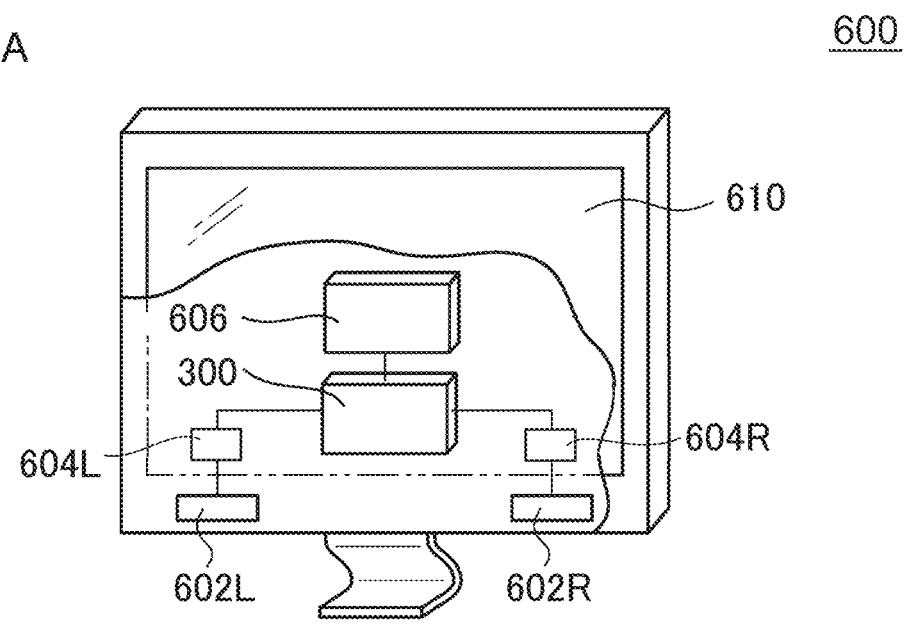
FIG. 12A and FIG. 12B are drawings showing electronic devices using audio amplifier circuits according to an embodiment of the present disclosure.
Figure 12B:
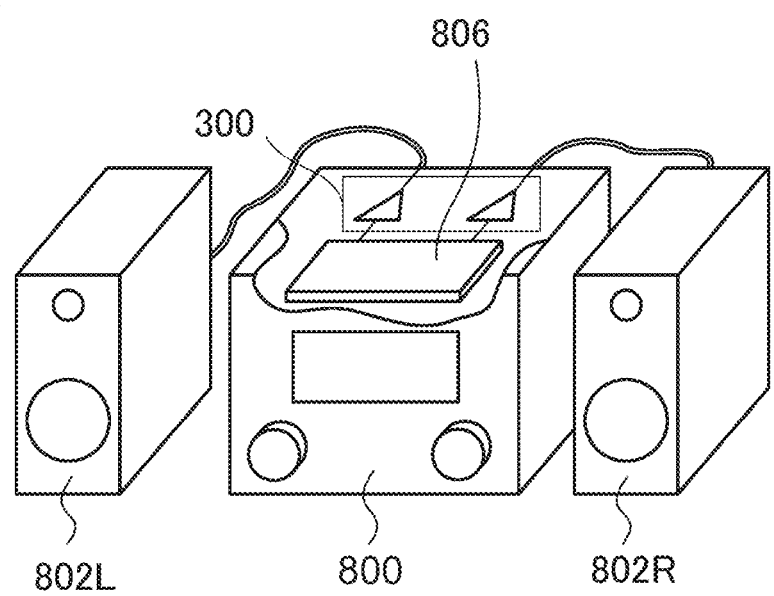

FIG. 12A and FIG. 12B are drawings showing electronic devices using audio amplifier circuits according to an embodiment of the present disclosure. The electronic device of FIG. 12A is a display apparatus 600 such as a television. The display apparatus 600 includes speakers 602L, 602R, filters 604L, 604R, a sound source 606, an audio amplifier circuit 200, and a display panel 610.

The electronic device of FIG. 12B is an audio component apparatus 800. The audio component apparatus 800 includes an audio signal processing circuit 806 equivalent to a sound source, an audio amplifier circuit 200, and filters (not shown). The audio amplifier circuit 200 drives the speakers 802L, 802R connected through speaker cables.

While the preferred embodiments of the present disclosure have been described using specific terms, such description is for illustrative purposes only, and it is to be understood that changes and variations may be made without departing from the spirit or scope of the appended claims.

What is claimed is:

1. A digital-to-analog (D/A) converter structured to convert an n-bit digital signal, where n≥2, into differential analog signals, the D/A converter comprising:
   a high-order converter structured to generate a first high-order voltage and a second high-order voltage that monotonously change with mutually opposite polarities with respect to high-order m bits of the digital signal, where 1≤m<n;
   a low-order converter structured to generate a first low-order voltage and a second low-order voltage that monotonously change with mutually opposite polarities with respect to low-order (n−m) bits of the digital signal;
   a first amplifier structured to receive one of the first and the second high-order voltages and one of the first and the second low-order voltages to output one of the differential analog signals; and
   a second amplifier having a configuration in common with the first amplifier, the second amplifier being structured to receive another of the first and the second high-order voltages and another of the first and the second low-order voltages to output another of the differential analog signals.

2. The D/A converter according to claim 1, wherein
   the first high-order voltage monotonously increases with respect to the high-order m bits,
   the second high-order voltage monotonously decreases with respect to the high-order m bits in such a way that the first and the second high-order voltages are complementary to each other,
   the first low-order voltage monotonously decreases with respect to the low-order (n−m) bits,
   the second low-order voltage monotonously increases with respect to the low-order (n−m) bits in such a way that the first and the second low-order voltages are complementary to each other,
   the first amplifier is a subtracting amplifier structured to receive the first high-order voltage at a non-inversion input terminal and the first low-order voltage at an inversion input terminal, and
   the second amplifier is a subtracting amplifier structured to receive the second high-order voltage at a non-inversion input terminal and the second low-order voltage at an inversion input terminal.

3. The D/A converter according to claim 1, wherein
   the high-order converter includes:
   a high-order resistor string including a plurality of resistance elements connected in series;
   a high-order selector connected to a plurality of taps of the high-order resistor string; and
   a high-order decoder structured to control the high-order selector and select voltages produced at two out of the plurality of taps according to the high-order m bits, and
   the low-order converter includes:
   a low-order resistor string including a plurality of resistance elements connected in series;
   a low-order selector connected to a plurality of taps of the low-order resistor string; and
   a low-order decoder structured to control the low-order selector and select voltages produced at two out of the plurality of taps according to the low-order (n−m) bits.

4. The D/A converter according to claim 3, further comprising:
   a first resistor, a second resistor, and a third resistor that are disposed in series between a reference voltage terminal and a ground; and
   a fourth resistor connected in parallel with the low-order resistor string,
   wherein the high-order resistor string and the low-order resistor string are disposed in series on a path extending in parallel with the second resistor.

5. The D/A converter according to claim 4, wherein
   the first resistor, the second resistor, and the third resistor are paired with one another, and
   the high-order resistor string, the low-order resistor string, and the fourth resistor are paired with one another.

6. The D/A converter according to claim 3, wherein
   the high-order resistor string is arranged in a meander form, and the plurality of taps are arranged in a matrix with A rows and B columns, and
   the high-order selector includes:
   A pieces of row lines;
   B pieces of column lines;
   a first output line;
   a second output line;
   a plurality of high-order switches arranged in a matrix with the A rows and the B columns, one end of each of the plurality of high-order switches being connected to a corresponding one of the plurality of taps, other ends of the plurality of high-order switches in i-th row, where 1≤i≤A, being connected to the row line in i-th row, control terminals of the plurality of high-order switches in j-th column, where 1≤j≤B, being connected to the column line in j-th column;
   A piece of first output switches, one end of each of the A pieces of first output switches being connected to the first output line, another end of each of the A pieces of first output switches being connected to a corresponding one of the A pieces of row lines; and
   A piece of second output switches, one end of each of the A pieces of second output switches being connected to the second output line, another end of each of the A pieces of second output switches being connected to a corresponding one of the A pieces of row lines.

7. The D/A converter according to claim 6, wherein the plurality of high-order switches are complementary metal oxide semiconductor (CMOS) switches.

8. The D/A converter according to claim 3, wherein
the low-order resistor string is arranged in a meander form, and the plurality of taps are arranged in a matrix with C rows and D columns, and
the low-order selector includes:
C pieces of row lines;
D pieces of column lines;
a third output line;
a fourth output line;
a plurality of low-order switches arranged in a matrix with the C rows and the D columns, one end of each of the plurality of low-order switches being connected to a corresponding one of the plurality of taps, other ends of the plurality of low-order switches in i-th row, where $1 \leq i \leq C$, being connected to the row line in i-th row, control terminals of the plurality of low-order switches in j-th column, where $1 \leq j \leq D$, being connected to the column line in j-th column;
C pieces of third output switches, one end of each of the C pieces of third output switches being connected to the third output line, another end of each of the C pieces of third output switches being connected to a corresponding one of the C pieces of row lines; and
C pieces of fourth output switches, one end of each of the C pieces of fourth output switches being connected to the fourth output line, another end of each of the C pieces of fourth output switches being connected to a corresponding one of the C pieces of row lines.

9. The D/A converter according to claim 8, wherein the plurality of low-order switches are N-channel metal-oxide semiconductor (NMOS) switches.

10. An audio amplifier circuit comprising:
the D/A converter according to claim 1 structured to convert a digital audio signal into differential analog signals;
a first power amplifier structured to amplify one of the differential analog signals; and
a second power amplifier structured to amplify another of the differential analog signals.

11. The audio amplifier circuit according to claim 10, wherein
the first power amplifier and the second power amplifier are class-D amplifiers each including:
an output stage of an inverter-type;
an integrator structured to receive corresponding one of the differential analog signals and a feedback signal corresponding to a signal output from the output stage;
a comparator structured to convert an output from the integrator into a PWM signal; and
a driver structured to drive the output stage according to the PWM signal output from the comparator.

12. The audio amplifier circuit according to claim 11, further comprising:
an audio interface circuit structured to receive a digital audio signal; and
a frequency divider structured to divide a master clock signal received by the audio interface circuit and generate a periodic signal of triangular waves or sawtooth waves,
wherein the comparator compares the output from the integrator with the periodic signal and generates the PWM signal.

13. The audio amplifier circuit according to claim 10, wherein the audio amplifier circuit is monolithically integrated onto a substrate.

14. An electronic device comprising the audio amplifier circuit according to claim 10.

15. An in-vehicle audio system comprising the audio amplifier circuit according to claim 10.

* * * * *